US012298674B2

(12) United States Patent
Schulga et al.

(10) Patent No.: US 12,298,674 B2
(45) Date of Patent: May 13, 2025

(54) CONNECTING COMPONENTS OF AN OPTICAL IMAGING DEVICE

(71) Applicant: Carl Zeiss SMT GmbH, Oberkochen (DE)

(72) Inventors: Viktor Schulga, Lauchheim (DE); Maximilian Schwenk, Zöschingen (DE); Henner Baitinger, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 176 days.

(21) Appl. No.: 18/066,845

(22) Filed: Dec. 15, 2022

(65) Prior Publication Data

US 2023/0117243 A1 Apr. 20, 2023

Related U.S. Application Data

(63) Continuation of application No. PCT/EP2021/066835, filed on Jun. 21, 2021.

(30) Foreign Application Priority Data

Jun. 22, 2020 (DE) .......................... 102020207702.9

(51) Int. Cl.
*G03F 7/00* (2006.01)
(52) U.S. Cl.
CPC ................................ *G03F 7/70825* (2013.01)
(58) Field of Classification Search
CPC .................................................. G03F 7/70825
See application file for complete search history.

(56) References Cited

U.S. PATENT DOCUMENTS 3,669,393 A 6/1972 Paine et al.
3,824,000 A 7/1974 Burns
(Continued)

FOREIGN PATENT DOCUMENTS

DE 16 25 444 A 6/1970
DE 102016225926 A1 3/2017
DE 102019116212 A1 * 4/2020

OTHER PUBLICATIONS

German Office Action, with translation thereof, for corresponding DE Appl 10 2020 207 702.9, dated Dec. 9, 2022.
(Continued)

*Primary Examiner* — Hung V Nguyen
(74) *Attorney, Agent, or Firm* — Fish & Richardson P.C.

(57) ABSTRACT

An arrangement of a microlithographic imaging device includes a first component, a second component and a connection unit of a connection device. The connection unit is configured to cooperate with the first component in a connection region between the first and second components. The connection unit is configured to cooperate, in a mounted state, with a tensioning unit of the connection device in a tensioning direction. The tensioning unit cooperates with the second component to connect the first and second component to one another in the connection region. The connection unit includes a main body. The insert is inserted in a receiving cutout in the main body and connected to the main body to transfer forces in the tensioning direction. The insert is configured to cooperate with the tensioning unit to connect the first and second components to one another in the connection region.

22 Claims, 3 Drawing Sheets

(56) References Cited

U.S. PATENT DOCUMENTS

| | | |
|---|---|---|
| 6,264,165 B1 | 7/2001 | Ohtomo et al. |
| 2011/0185831 A1 | 8/2011 | Kozak |
| 2019/0083155 A1* | 3/2019 | Bryant .............. A61B 17/8861 |

OTHER PUBLICATIONS

Translation of International Search Report for corresponding PCT/EP2021/066835, dated Oct. 15, 2021.

Translation of International Preliminary Report on Patentability for corresponding PCT/EP2021/066835, dated Jan. 5, 2023.

\* cited by examiner

CONNECTING COMPONENTS OF AN OPTICAL IMAGING DEVICE

CROSS-REFERENCE TO RELATED APPLICATIONS

The present application is a continuation of, and claims benefit under 35 USC 120 to, international application PCT/EP2021/066835, filed Jun. 21, 2021, which claims benefit under 35 USC 119 of German Application No. 10 2020 207 702.9, filed Jun. 22, 2020. The entire disclosure of these applications are incorporated by reference herein.

FIELD

The present disclosure relates to an arrangement of a microlithographic imaging device suitable for the use of used UV light, such as light in the extreme ultraviolet (EUV) range. Furthermore, the disclosure relates to an optical imaging device comprising such an arrangement. The disclosure can be used in conjunction with any desired optical imaging methods. It can be used for example in the production or the inspection of microelectronic circuits and the optical components used for them (for example optical masks).

BACKGROUND

The optical devices used in conjunction with the production of microelectronic circuits typically comprise a plurality of optical element units comprising one or more optical elements, such as lens elements, mirrors or optical gratings, which are arranged in the imaging light path. The optical elements typically cooperate in an imaging process in order to transfer an image of an object (for example a pattern formed on a mask) to a substrate (for example a so-called wafer). The optical elements are typically combined in one or more functional groups, which are possibly held in separate imaging units. For example in the case of principally refractive systems that operate with a wavelength in the so-called vacuum ultraviolet range (VUV, for example at a wavelength of 193 nm), such imaging units are often formed from a stack of optical modules holding one or more optical elements. The optical modules typically comprise a supporting structure having a substantially ring-shaped outer supporting unit, which supports one or more optical element holders, which in turn hold the optical element.

The ever-advancing miniaturization of semiconductor components results in a constant demand for increased resolution of the optical systems used for their production. This desire for increased resolution involves a desire for an increased numerical aperture (NA) and an increased imaging accuracy of the optical systems.

One approach for obtaining an increased optical resolution is to reduce the wavelength of the light used in the imaging process. The trend in recent years has increasingly fostered the development of systems in which light in the so-called extreme ultraviolet (EUV) range is used, typically at wavelengths of 5 nm to 20 nm, in most cases at a wavelength of approximately 13 nm. In this EUV range it is generally no longer possible to use conventional refractive optical systems. This is owing to the fact that in this EUV range the materials used for refractive optical systems have an absorbance that is generally too high to achieve acceptable imaging results with the available light power. Consequently, in this EUV range it is often desirable to use reflective optical systems for the imaging.

This transition to purely reflective optical systems having a high numerical aperture (e.g. NA>0.4 to 0.5) in the EUV range can result in considerable challenges with regard to the design of the imaging device.

The factors mentioned above can result in very stringent factors with regard to the position and/or orientation of the optical elements participating in the imaging relative to one another and also with regard to the deformation of the individual optical elements in order to achieve a desired imaging accuracy. Moreover, it is desirable to maintain this high imaging accuracy over operation in its entirety, ultimately over the lifetime of the system.

As a consequence, it is desirable for the components of the optical imaging device (i.e., for example, the optical elements of the illumination device, the mask, the optical elements of the projection device and the substrate) which cooperate during the imaging to be supported in a relatively well-defined manner in order to maintain a predetermined relatively well-defined spatial relationship between these components and to obtain a minimal undesired deformation of these components in order ultimately to achieve the relatively high imaging quality.

For example in the case of the VUV or EUV systems mentioned above, an issue can arise that, despite the high factors for the tolerances that are to be maintained, they are structurally comparatively large systems, the structures of which consist of multiple components possibly detachably connected to one another, which moreover in some cases are subject to certain temperature gradients during operation. In the case of known systems, these components are often connected via tensioning screws screwed into corresponding threaded inserts in one of the components in order to brace the two components against one another.

The threaded inserts are typically adhesively bonded to the associated component and are adapted to this component in terms of their coefficient of thermal expansion (CTE) in order to avoid stresses in the adhesive bond owing to different degrees of thermal expansion. An issue in this respect can be that, when the screws are being tightened, in the threaded insert fretting effects can arise that subject the adhesive bond to high load and can result in it failing. Accordingly, use is typically made of screws with a low fretting tendency (for example gold screws). However, they also have a comparatively low strength, which delimits the possible tightening torques or pretensioning forces. Further undesired loads (typically tensile loads) on the adhesive bond result from the deformation of such threaded inserts in the course of tightening. These issues can be still further exacerbated in that typically, on account of the high-grade functional integration in the region of these structural components, there is relatively little installation space available for the connection elements.

In the case of known systems of this type, during operation subtle or even sudden changes in the geometry of the structures (that is to say drift effects or skip effects) arise that occur randomly and disorderedly sometimes. These structural "instabilities" can be caused by random undesired relative movements in the region of the described joins of the individual components. These relative movements can of course be caused, for example, by external mechanical disruptions, such as vibrations or even shock loads.

Equally, however, such structural "instabilities" can also be caused by stresses resulting from different degrees of thermal expansion of the components. In this respect, even in the case of materials with a nominally identical coefficient of thermal expansion (CTE), owing to local variations in the coefficient of thermal expansion, high stiffnesses or different stiffnesses, high transverse forces leading to undesired relative movements or displacements can be produced at the joints.

When such relative movements or displacements between the components take place in the course of a heat treatment in the mounted state (as can be the case for ceramic components), this can be very difficult to control or predict. Moreover, there can be a comparatively high risk that the displacement does not reset after the heat treatment is concluded and the result can thus be a pretensioned connection which, at a later, unpredictable point in time, possibly resets only during operation (for example owing to a shock load) and leads to misalignment of the system. This can result in not usable exposure results and time-consuming and expensive recalibration of the system. In all other respects, such a pretensioned connection between the components can also be generated by corresponding loads when the connected components are being produced or transported.

SUMMARY

The disclosure seeks to provide an arrangement of a microlithographic imaging device and a corresponding optical imaging device having such an arrangement, and a method for connecting components of such an imaging device, which do not have the aforementioned disadvantages, or have them at least to a lesser extent, and, for example, easily obtain a connection of components of the imaging device that is geometrically stable in the long term.

The disclosure involves the technical teaching that a connection of components of the imaging device that is stable in the long term is easily achieved when the possible tightening torques or pretensioning forces are increased without an appreciably increasing the installation space, in that the connection unit is formed at least in two parts with a main body and an insert that cooperates with the tensioning unit. In that case, the main body can be adapted to the associated component and the connection thereto for example in terms of the coefficients of thermal expansion without problems, whereas the insert can be adapted to the use of high-strength tensioning units (for example in terms of undesired effects when the pretensioning force is applied). This makes it possible to achieve considerably higher pretensioning forces between the two components to be connected, which considerably reduces the risk of undesired relative movements or displacements between the two connected components.

The at least two-part form of the connection unit therefore means that the properties of the respective part of the connection unit can be adapted to the element with which the relevant part of the connection unit directly cooperates (that is to say: adaptation or optimization of the main body in terms of the associated component and adaptation or optimization of the insert in terms of the associated tensioning unit). Deviations in the properties of the main body and of the insert can be compensated within the connection unit (for example in the coupling region between the main body and the insert) without resulting in adverse effects at the interfaces between the main body and the associated component or between the insert and the tensioning unit.

For example, the insert can be used to achieve a defined introduction of stresses into the main body resulting from the pretensioning force that is over as large as possible a surface area and thus more uniformly and favorably distributed than in the case of existing configurations. The interfaces between the tensioning element and the insert and between the insert and the main body can be adapted or optimized correspondingly in turn in terms of the respective material pairing. Therefore, more degrees of optimization freedom are obtained as a result of this at least two-part form. This can be a considerable advantage over the existing configuration, in which only one such interface was present (specifically between the tensioning element and the monolithic connection element).

It is self-evident here that the insert and/or the main body may for their part likewise have a multi-part form. In this way, the properties can be adapted even more finely or gradually, and severe jumps in the properties of the components (e.g. stiffness) or of their materials (e.g. modulus of elasticity, coefficient of thermal expansion, etc.) at their interfaces can be avoided. Therefore, differences in the properties between the tensioning element and the main body, or ultimately the first component, can be compensated over multiple interfaces.

According to one aspect, the disclosure therefore relates to an arrangement of a microlithographic imaging device, for example for the use of light in the extreme UV (EUV) range, which comprises a first component and a second component. The arrangement comprises a connection unit of a connection device, wherein the connection unit is configured to cooperate with the first component in a connection region between the first component and the second component. Furthermore, the connection unit is configured, in a mounted state, to cooperate with a tensioning unit of the connection device in a tensioning direction, wherein the tensioning unit cooperates with the second component in order to connect the first component and the second component to one another in the connection region. The connection unit has a main body and an insert. The insert is inserted in a receiving cutout in the main body and connected to the main body in order to transfer forces in the tensioning direction. The insert is configured to cooperate with the tensioning unit in order to connect the first component and the second component to one another in the connection region. The insert may optionally project out of the main body. However, the insert can be completely received in the receiving cutout in the main body or completely inserted in the receiving cutout, respectively, since loads can be transferred only via the physical interface between the insert and the main body in any case. In this way, it is possible to achieve a relatively compact arrangement with utilization of the available installation space that is as optimal as possible.

Basically, the insert may be connected to the main body in any desired suitable way in order to achieve favorable introduction of the loads or stresses into the main body. Form-fitting, force-fitting and materially bonded connections (in one or more of the six degrees of freedom in space) can be used individually or in any desired combination. Configurations with the above-described favorable introduction of loads or stresses into the main body are achieved when the insert is connected to the main body via a form-fitting and/or a force-fitting connection. Relatively simple and favorable configurations are produced when the insert is connected to the main body via a screwed connection, since this results in a comparatively large contact surface in which local tolerances or deviations can be compensated by comparatively small local deformations. In this respect, so-called fine threads (with a smaller pitch than so-called standard threads) can be of course relatively advantageous, since they provide a relatively large contact surface at a comparatively small volume or installation space. In this respect, a thread run of the screwed connection defines a thread longitudinal axis, which then can runs at least substantially parallel to the tensioning device in order to achieve a configuration that can be joined relatively easily.

The insert can be secured against rotation with respect to the main body about an axis of rotation parallel to the tensioning direction, since this makes it possible to ensure that a torque introduced by the tensioning element does not result in rotation of the insert with respect to the main body (therefore ensures a clear functional separation of the load introduction mechanisms at the interfaces of the insert). The rotation-prevention mechanism may in principle be realized in any desired suitable way (form fit and/or frictional engagement and/or material bond). Thus, for example, an adhesive bond between the insert and the main body can be used as a rotation-prevention mechanism. Similarly, one or more portions of the insert and/or of the main body can be elastically and/or plastically deformed in order to obtain the rotation-prevention mechanism. Relatively simple variants comprise at least one rotation-prevention element, which secures the insert against rotation about the axis of rotation.

The rotation-prevention mechanism may be in the form of a simple element (such as a clamp, a pin or a screw etc.), which is inserted (e.g. plugged in, screwed in or latched in etc.) for example into a corresponding cutout in one part of the pairing (insert or main body) and, in its end position, (by way of a form fit and/or frictional engagement) cooperates with the other part of the pairing (main body or insert, respectively) in order to prevent rotation of the insert with respect to the main body. Similarly, such an element may also be formed in one piece with one of the two parts of the pairing. It is self-evident that it is also possible to use any desired combinations of the aforementioned rotation-prevention mechanism.

The tensioning unit and the insert may in principle be connected to one another in any desired suitable way (likewise a form fit and/or frictional engagement and/or material bond). In this respect, it is of course possible to provide a functional separation between the tensioning mechanism and the connection to the insert. In simple and space-saving configurations, both functions are incorporated. This can again be realized, for example, by connecting the tensioning unit and the insert to one another in the mounted state via a form-fitting and/or a force-fitting connection, for example via a screwed connection. The tensioning unit may thus, for example, simply be in the form of a tensioning screw which is screwed into a threaded bore in the insert in the tensioning direction.

The coupling of the tensioning unit to the second component can in principle likewise be effected in any desired suitable way (form fit and/or frictional engagement and/or material bond). In simple variants, the tensioning unit may comprise a bearing portion, for example a head portion, which cooperates with the second component in a form-fitting manner in the tensioning direction. Furthermore, part of the tensioning unit may be guided through a cutout, running in the tensioning direction, in the second component. However, it is similarly also possible for the tensioning element to laterally engage around the second component in the manner of a clamp.

The insert may be designed in any desired way suitable for coupling to the main body. In certain variants, the insert has an outer side for coupling to the main body and an inner side for coupling to the tensioning unit. In this respect, the outer side may have a first thread for coupling to the main body and/or the inner side may have a second thread for coupling to the tensioning unit. It is then possible for a first thread run of the first thread to define a first thread longitudinal axis and a second thread run of the second thread to define a second thread longitudinal axis, wherein the first thread longitudinal axis runs at least substantially parallel to the second thread longitudinal axis. This makes it possible to achieve a compact configuration which is relatively easy to produce and easy to join. In addition or as an alternative, the insert may have a substantially cylindrical form and/or be formed in the manner of a sleeve. This can also be advantageous in terms of production, joining and the installation space involved.

Relatively favorable configurations are produced when the insert has a maximum length dimension in the longitudinal direction which amounts to 50% to 90%, such as 55% to 85%, for example at most 60% to 80%, of the maximum length dimension of the main body in the longitudinal direction. This makes it possible to achieve, for example, a relatively favorable and uniform introduction of the loads into the main body over a large surface area.

It can be furthermore advantageous when the insert has a maximum length dimension in the longitudinal direction and a maximum radial dimension in the radial direction, wherein the maximum length dimension amounts to 80% to 500%, such as 150% to 300%, for example 200% to 250%, of the maximum radial dimension of the insert. Furthermore, for example as a result of the type of the thread (standard thread, fine thread etc.) and the material pairing between the insert and the main body, a certain minimum screw-in depth for screwing the insert into the main body is provided for a predefined maximum pretensioning force, wherein the value of the maximum length dimension then can range from 100% to 200%, such as from 120% to 180%, for example from 140% to 160%, of the minimum screw-in depth. This makes it possible to realize respectively relatively compact configurations still with favorable introduction of loads into the main body. The same applies when the first thread has a first thread diameter and the second thread has a second thread diameter, wherein the first thread diameter amounts to 110% to 500%, such as 120% to 400%, for example 150% to 250%, of the second thread diameter.

The materials used, for example, their coefficients of thermal expansion, can be adapted to one another. Therefore, the material of the first component thus has a first coefficient of thermal expansion, whereas the material of the main body has a second coefficient of thermal expansion, which can be adapted to one another. In variants, the main body is connected to the first component via a materially bonded connection, for example, an adhesive bond, in a mounted state. The first coefficient of thermal expansion and the second coefficient of thermal expansion can then be adapted to one another in such a way that a maximum stress in the materially bonded connection that is expected as a maximum in the event of thermal expansion during production and/or during normal operation of the arrangement amounts to at most 90%, such as at most 75%, for example at most 45% to 55%, of a maximum permissible stress in the materially bonded connection. This configuration can for example be advantageous when the maximum stress in the materially bonded connection is to be expected in the event of a heat treatment of the arrangement during production, since this makes it possible to reliably avoid damage during production.

In some variants, the second coefficient of thermal expansion differs from the first coefficient of thermal expansion by less than 200%, such as less than 100%, for example less than 10% to 50%, of the first coefficient of thermal expansion, since this makes it possible to achieve relatively favorable results.

In terms of the selection of materials, there is a very great freedom of selection by virtue of the two-part form of the connection unit. In favorable variants, the first component and/or the second component comprises at least one ceramic material, wherein the ceramic material, for example, comprises reaction-bonded, silicon-infiltrated silicon carbide (SiSiC) and/or silicon carbide (SiC) and/or aluminum oxide ceramic ($Al_2O_3$) and/or silicon nitride ceramic ($Si_3N_4$) and/or zirconium oxide ($ZrO_2$) and/or aluminum titanate ($Al_2TiO_5$), or at least one metallic material having a low coefficient of thermal expansion, for example Inermet® (tungsten heavy metal with at least 90% tungsten) and/or molybdenum (Mo) and/or a titanium-zirconium-molybdenum alloy (TZM).

The main body may comprise a material correspondingly suitable for coupling to the first component. The main body can comprise at least one metallic material with a modulus of elasticity amounting to at least 220 GPa, such at least 250 GPa to 320 GPa, for example at least 280 GPa to 300 GPa. This makes it possible to realize configurations enabling a high stiffness and thus a favorable introduction of load into the first component for a relatively compact structure. In further variants, the main body comprises at least molybdenum (Mo) and/or a titanium-zirconium-molybdenum alloy (TZM) and/or a tungsten alloy. These are relatively suitable for coupling to the materials mentioned for the first component.

The material of the insert and of the tensioning unit can also be of course adapted to the specific use case and its boundary conditions, for example adapted to the pretensioning force that is to be achieved between the components to be connected. In certain variants, therefore, a maximum pretensioning force that, in the mounted state, is exerted by the connection device in the tensioning direction between the first component and the second component in the connection region is predefined. In that case, the insert can comprise a first material and the tensioning unit comprises a second material, wherein the first material and the second material are adapted to one another in such a way that no fretting effects occur when the maximum pretensioning force is applied to the contact surfaces between the insert and the tensioning unit. This makes it possible for example to ensure that a predefined pretensioning force is also actually achieved for a predefined tightening torque. It can be relatively advantageous when the insert comprises at least one nitrogen-strengthened stainless steel alloy, for example Nitronic 60, and/or gold-plated steel and/or silver-plated steel and/or kolsterised steel. It can be similarly advantageous when the tensioning unit comprises at least one high-strength austenitic stainless steel alloy, for example A4-70 and/or A4-80 and/or A5-80 and/or Inconel and/or A-286, and/or MP35N and/or HiMo88.

The main body may in principle be configured in any desired suitable way in order to achieve the desired coupling to the first component. In variants, the main body defines a longitudinal direction, a radial direction running transversely to the longitudinal direction, and a circumferential direction running circumferentially around the longitudinal direction, wherein the main body then has at least one projection extending in the radial direction and in the circumferential direction. The projection may run substantially around the entire circumference in the circumferential direction, but similarly multiple circumferentially spaced-apart projections may also be provided. The at least one projection has a first contact surface, via which a form fit is produced in the tensioning direction with a second contact surface of the first component in the mounted state. This makes it possible to obtain simple and compact configurations. It can be sufficient for the main body and the first component to make contact with one another in the region of the contact surfaces. In variants with a precisely defined spatial relationship between the main body and the first component, the main body and the first component, in the mounted state, are connected to one another via a materially bonded connection, for example an adhesive bond, at least in the region of the first contact surface and the second contact surface.

In variants, a maximum pretensioning force that, in the mounted state, is exerted by the connection device in the tensioning direction between the first component and the second component in the connection region is predefined. The main body can then be configured in such a way that, when the maximum pretensioning force is applied at least in the region of the first contact surface, a maximum stress in the main body is below the 0.2% yield strength of the material of the main body, wherein the maximum stress, for example, amounts to 75% to 95%, such as 80% to 92%, for example 85% to 90%, of the 0.2% yield strength of the material of the main body. This makes it possible to obtain a compact configuration for relatively good utilization of the strength properties of the main body, combined with reliable coupling of the first and the second component.

In addition or as an alternative, the main body may be configured in such a way that, when the maximum pretensioning force is applied, a maximum stress, for example a maximum shear stress, in the materially bonded connection between the first contact surface and the second contact surface is below a maximum permissible stress for the materially bonded connection. This makes it possible to reliably avoid failure of the materially bonded connection by way of the configuration of the main body. In this respect, the maximum stress in the materially bonded connection may, for example, amount to 75% to 95%, such as 80% to 92%, for example 85% to 90%, of the maximum permissible stress for the materially bonded connection, resulting in largely optimized conditions.

It is self-evident that the main body, in principle, can be configured in any desired suitable way. Thus, the main body may, for example, simply have a disk-shaped or plate-shaped form. In certain variants, in the longitudinal direction, the main body has a first portion and an adjacent second portion that forms the at least one projection. The first portion has a maximum diameter at a transition to the second portion in the radial direction. In this respect, the receiving cutout in the main body runs in the longitudinal direction of the main body, wherein the longitudinal direction in the mounted state can run in the tensioning direction.

The first portion can have a form that is elongate and/or prismatic at least in certain portions and/or cylindrical at least in certain portions in the longitudinal direction. In this respect, a maximum length dimension of the first portion in the longitudinal direction can amount to 150% to 300%, such as 180% to 250%, for example 200% to 230%, of the maximum diameter of the first portion. This makes it possible to obtain configurations with favorable introduction of load into the main body and transfer of the load into the first component. The same applies when, additionally or alternatively, a maximum wall thickness of the first portion in the longitudinal direction amounts to 2.5% to 25%, such as 5% to 20%, for example 10% to 15%, of the maximum diameter of the first portion.

A favorable introduction of load into the first component can furthermore be achieved when the at least one projection projects beyond the first portion in the radial direction by 110% to 250%, such as 120% to 220%, for example 150% to 200%, of the maximum diameter of the first portion. A stiffness distribution in terms of the introduction of load into the first component can be achieved, for example, when the at least one projection in the longitudinal direction has a thickness dimension, wherein the thickness dimension for example amounts to 150% to 300%, such as 160% to 250%, for example 180% to 200%, of the maximum diameter of the first portion.

The interfaces between the first and second components and the connection device may in principle be configured in any desired suitable way. Thus, it may be provided, for example, that the connection device laterally engages around the two components in the manner of a tension clamp. In certain variants, the first component has a first cutout, for example a first through opening, for receiving at least part of the main body, wherein the first component for example has a contact surface for making contact with a projection of the main body, which contact surface is adjacent to the first cutout and faces in the direction of a longitudinal axis of the first through opening. This makes it possible to achieve relatively simple and structurally small configurations with favorable introduction of load into the first component. The same applies when the second component has a second cutout, for example a second through opening, for receiving at least part of the tensioning unit, wherein the second component, for example, has a contact surface for making contact with a bearing portion, for example a head portion, of the tensioning unit, which contact surface is adjacent to the second cutout and faces in the direction of a longitudinal axis of the second through opening.

The interface between the first component and the second component may likewise be configured as desired. It is thus possible, for example, to arrange an interface element between the first component and the second component. In certain variants, the first component and the second component, in the mounted state, make contact with one another in the region of at least one interface portion. This interface portion may be spaced apart from the tensioning unit to a greater or lesser extent. The interface portion can be arranged in the region of the tensioning unit, wherein the interface portion, for example, can then surround the tensioning unit in order to easily achieve a favorable distribution of the surface pressure created by the connection device between the first and the second component.

The first and the second component may be any desired components of the imaging device that are connected to one another with corresponding operational reliability and dimensional accuracy. In certain variants, the first component and the second component are parts of an illumination device or of a projection device of the imaging device. They may, for example, be parts of a support structure of the imaging device that bears highly sensitive components of the imaging device. The above-described features can have a relatively good effect when the first component and the second component are components of a sensor frame that bears at least one sensor unit. Similar features can result when the first component and the second component are parts of a mask device of an imaging device, for example, parts of a support structure for a mask of the imaging device. The same applies when the first component and the second component are parts of a substrate device of the imaging device, for example are parts of a support structure for a substrate, for example, a wafer, of the imaging device.

The present disclosure also relates to an optical imaging device, for example a microlithographic optical imaging device, comprising an illumination device having a first optical element group, an object device for receiving an object, a projection device having a second optical element group, and an image device, wherein the illumination device is designed to illuminate the object and the projection device is designed to project an image of the object onto the image device. The illumination device and/or the object device and/or the projection device and/or the image device comprises at least one arrangement according to the disclosure. This makes it possible to realize the variants and features described above to the same extent, and so reference is made to the explanations given above in this respect.

The present disclosure furthermore relates to a method for connecting a first component and a second component of a microlithographic imaging device, for example, for the use of light in the extreme UV (EUV) range, in which method a connection unit of a connection device is brought into engagement with the first component in such a way that the connection unit cooperates with the first component in a connection region between the first component and the second component. Furthermore, a tensioning unit of the connection device is brought into engagement with the connection unit and with the second component in such a way that the connection unit cooperates with the tensioning unit in a tensioning direction in order to connect the first component and the second component to one another in the connection region. A main body having an insert is used for the connection unit, wherein the insert is inserted into a receiving cutout in the main body and connected to the main body in order to transfer forces in the tensioning direction. The insert cooperates with the tensioning unit in order to connect the first component and the second component to one another in the connection region. This also makes it possible to realize the variants and features described above to the same extent, and so reference is made to the explanations given above in this respect.

In a first step, the connection between the connection unit and the first component can be established, wherein the connection unit for example is adhesively bonded to the first component. In a second step, which follows the first step, the first component and the second component are then brought into contact with one another in a connection region. In the process, an intermediate element can optionally be introduced between the first component and the second component. In a third step, which follows the second step, the tensioning unit is brought into engagement with the connection unit and with the second component in such a way that the first component and the second component can be connected to one another in the connection region.

In this respect, it can be provided that the connection device is used to exert an actual pretensioning force in the tensioning direction between the first component and the second component in the connection region, which actual pretensioning force is greater than a nominal pretensioning force to fix the first component and the second component to one another under all loads to be expected during normal operation or during the production of the imaging device. The actual pretensioning force, for example, amounts to 120% to 250%, such as 150% to 220%, for example 160% to 200%, of the nominal pretensioning force. This makes it possible to achieve a reliable fixation of the two components to one another, in the case of which the above-described creep or skip effects can be avoided.

Further aspects and embodiments of the disclosure are evident from the dependent claims and the following description of embodiments, which refers to the accompanying figures. All combinations of the disclosed features, irrespective of whether or not they are the subject of a claim, lie within the scope of protection of the disclosure.

DETAILED DESCRIPTION

First Embodiment

Figure 1:
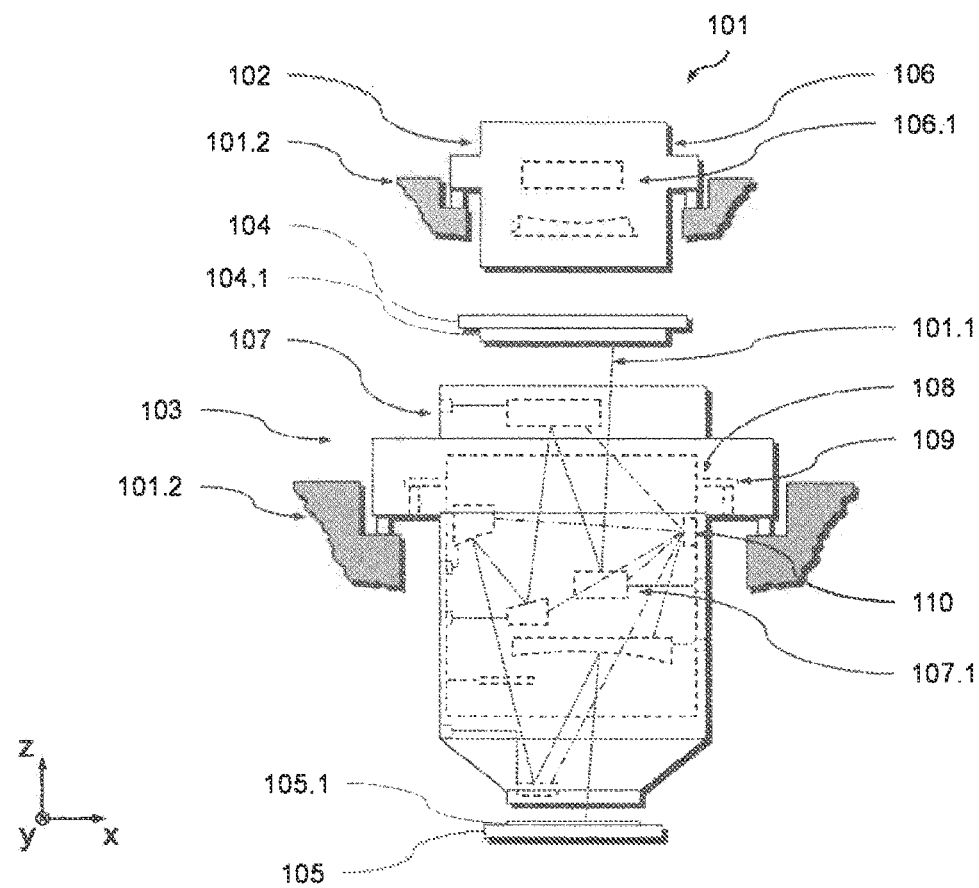
FIG. 1 is a schematic illustration of an embodiment of an optical imaging device according to the disclosure, which comprises an embodiment of an optical arrangement according to the disclosure.

An embodiment of an optical imaging device according to the disclosure in the form of a microlithographic projection exposure apparatus 101, which comprises an embodiment of an arrangement according to the disclosure, is described below with reference to FIGS. 1 to 5. To simplify the following explanations, an x, y, z coordinate system is indicated in the drawings, the z direction running counter to the direction of gravitational force. It goes without saying that it is possible in further configurations to choose any desired other orientations of an x, y, z coordinate system.

FIG. 1 is a schematic, not-to-scale illustration of the projection exposure apparatus 101, which is used in a microlithographic process for producing semiconductor components. The projection exposure apparatus 101 comprises an illumination device 102 and a projection device 103. The projection device 103 is designed to transfer an image of a structure of a mask 104.1, which is disposed in a mask unit 104, onto a substrate 105.1, which is disposed in a substrate unit 105, in an exposure process. For this purpose, the illumination device 102 illuminates the mask 104.1. The optical projection device 103 receives the light from the mask 104.1 and projects the image of the mask structure of the mask 104.1 onto the substrate 105.1, such as for example a wafer or the like.

The illumination device 102 comprises an optical unit 106 with an optical element group 106.1. The projection device 103 comprises a further optical unit 107 with an optical element group 107.1. The optical element groups 106.1, 107.1 are disposed along a folded central ray path 101.1 of the projection exposure apparatus 101. Each of the optical element groups 106.1, 107.1 may comprise a plurality of optical elements.

In the present embodiment, the projection exposure apparatus 101 operates with used light in the EUV range (extreme ultraviolet radiation), with wavelengths between 5 nm and 20 nm, for example with a wavelength of 13 nm. The optical elements of the element groups 106.1, 107.1 of the illumination device 102 and the projection device 103 are therefore exclusively reflective optical elements. The optical element groups 106.1, 107.1 may comprise one or more optical arrangements according to the disclosure, as is described below on the basis of the optical arrangement 108. The optical units 106 and 107 are each supported by way of a support structure 101.2.

In further configurations of the disclosure, it is also possible (for example depending on the wavelength of the illumination light), of course, to use any type of optical elements (refractive, reflective, diffractive) alone or in any desired combination for the optical modules. For example, the projection exposure apparatus 101 may thus also operate with used light in the so-called vacuum ultraviolet range (VUV, for example at a wavelength of 193 nm).

Figure 2:
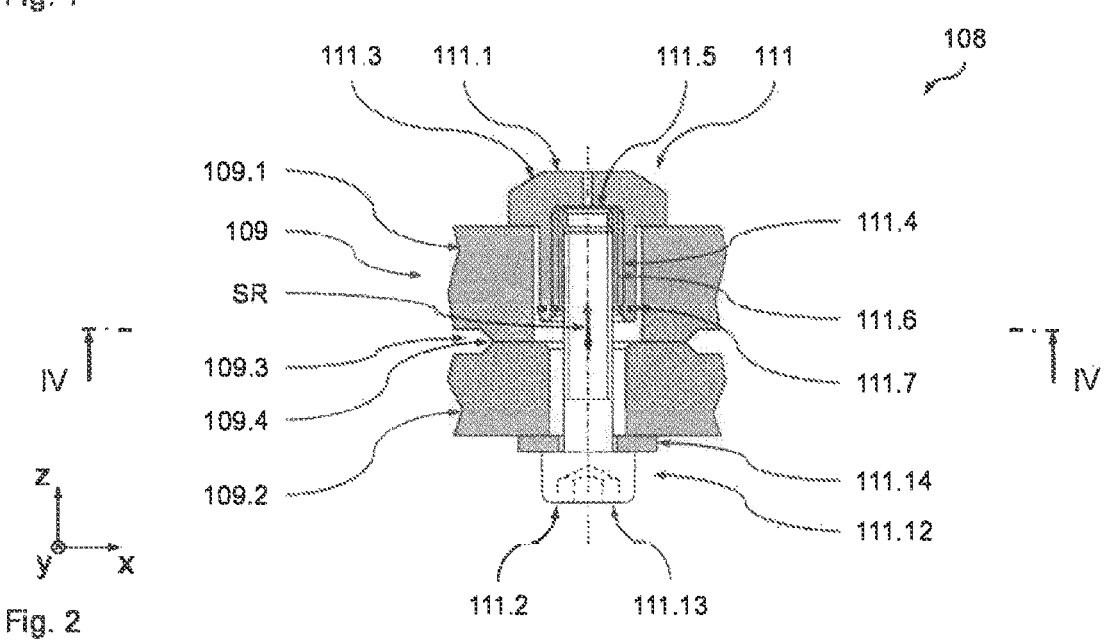
FIG. 2 is a schematic sectional view of the arrangement according to the disclosure from FIG. 1 in the mounted state.
Figure 3:
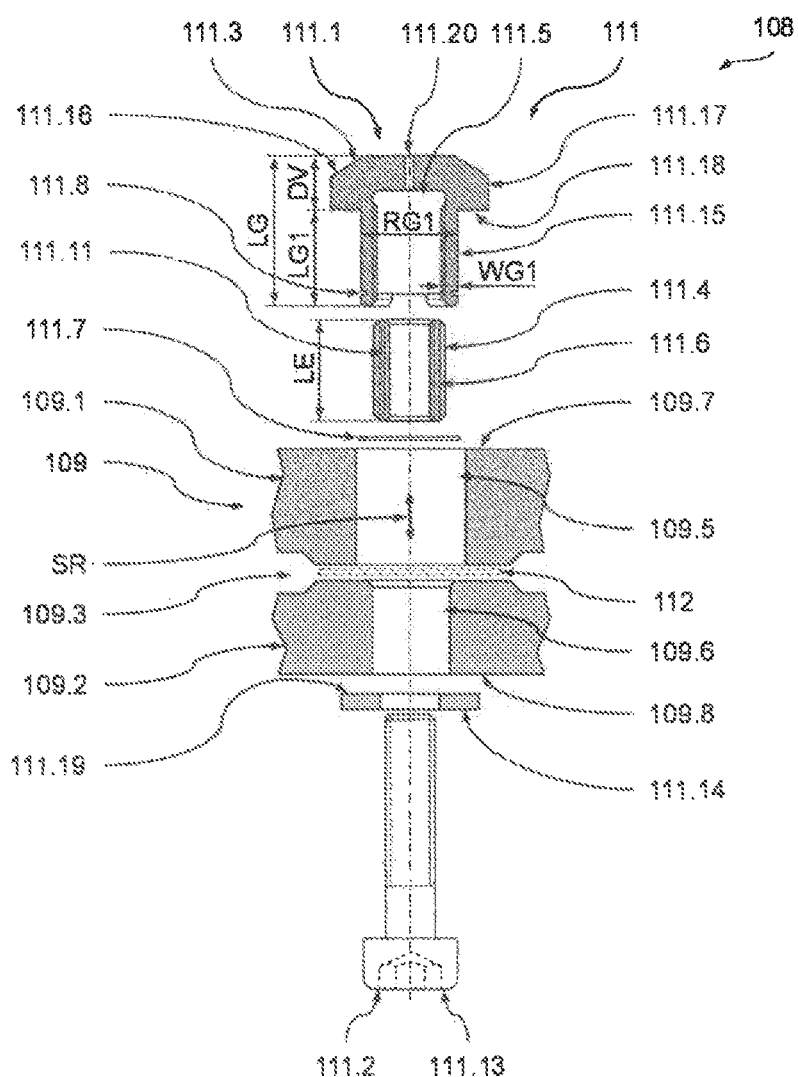
FIG. 3 is an exploded illustration of the arrangement according to the disclosure from FIG. 2.
Figure 4:
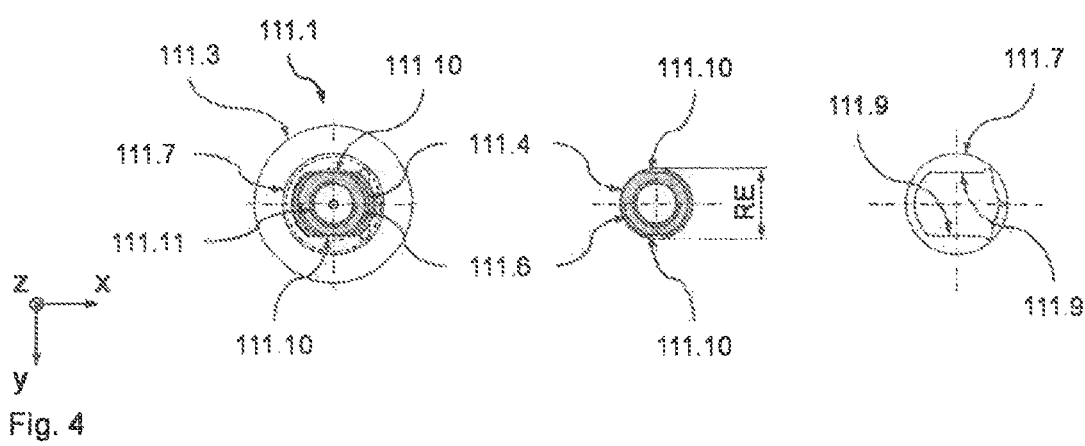
FIG. 4 is a schematic sectional view (along the line IV-IV in FIG. 2) of parts of the arrangement according to the disclosure from FIG. 2.

The arrangement according to the disclosure is described below in exemplary fashion on the basis of the arrangement 108. FIGS. 2 and 3 each show a schematic sectional view of the arrangement 108 (FIG. 2 in the mounted state, FIG. 3 in an exploded illustration), while FIG. 4 shows a schematic sectional view (along the line IV-IV from FIG. 2) of part of the arrangement 108.

As can be seen in FIGS. 1, 2 and 3, in the present example the arrangement 108 is located in the region of a support structure in the form of a so-called sensor frame 109 of the projection device 103. The sensor frame 109 supports a series of sensor devices (indicated in highly schematic fashion in FIG. 1 by the outline 110), which, in the projection device 103, capture the position and orientation, among other things, of the optical elements of the optical element group 107.1 with respect to a predefined reference. The information obtained by the sensor devices 110 is then used to actuate active components while the wafer 105.1 is being exposed and thus to achieve the desired exposure result.

The sensor frame 109 is consequently a comparatively complex and large structure which desirably meet extremely high accuracy factors throughout the operation of the imaging device 101, and therefore desirably also respect very narrow tolerances. For that purpose, the sensor frame 109 is constructed in a differential construction from multiple components connected to one another, a first component 109.1 and a second component 109.2 of which are illustrated in FIGS. 2 and 3.

In the case of known sensor frames of this type, during operation, creeping or even sudden changes in the geometry of the sensor frame (that is to say drift effects or skip effects) sometimes arise that occur randomly and disorderedly. These structural "instabilities" can be caused by random undesired relative movements in the region of the described joins of the individual components. These relative movements can of course be caused, for example, by external mechanical disruptions, such as vibrations or even shock loads. Equally, however, such structural "instabilities" can also be caused by stresses resulting from different degrees of thermal expansion of the joined components. In this respect, even in the case of materials with a nominally identical coefficient of thermal expansion (CTE), owing to local variations in the coefficient of thermal expansion, high stiffnesses or different stiffnesses, high transverse forces can be produced that lead to undesired relative movements or displacements at the joins of the components.

When such relative movements or displacements between the joined components take place in the course of a heat treatment in the mounted state (as can be the case for ceramic components), this is not only very difficult to control or predict. Moreover, there is a comparatively high risk that the displacement does not reset after the heat treatment is concluded and the result is thus a pretensioned connection which, at a later, unpredictable point in time, possibly resets only during operation (for example owing to a shock load) and leads to misalignment of the system. This results in not usable exposure results and time-consuming and expensive recalibration of the system. In the worst case, it is even desirable to exchange parts of the system.

In order to avoid these effects, in the present example the first component 109.1 and the second component 109.2 are connected at one or typically more spaced-apart locations via a connection device 111, which comprises a connection unit 111.1 and a tensioning unit in the form of a tensioning screw 111.2. To that end, in a connection region 109.3 between the first component 109.1 and the second component 109.2, in a mounted state (see FIG. 2), the connection unit 111.1 cooperates on the one hand with the first component 109.1 by engaging behind it. The connection unit 111.1 furthermore cooperates with the tensioning unit 111.2 in a tensioning direction SR. To that end, the tensioning unit 111.2 is screwed into the connection unit 111.1 and for its part cooperates with the second component 109.2 by engaging behind it. As a result, the first component 109.1 and the second component 109.2 are connected to one another in the connection region 109.3, in that the first component 109.1 and the second component 109.2 make contact with one another in a contact region 109.4 and are braced against one another by a pretensioning force FV in the tensioning direction SR.

In the present example, the connection unit 111.1 has a main body 111.3 and an insert 111.4. In the present example, the insert 111.4 is completely inserted in a receiving cutout 111.5 in the main body 111.3 and connected to the main body 111.3 in order to transfer forces in the tensioning direction SR. The tensioning unit 111.2 furthermore cooperates with the insert 111.4 in that the tensioning unit 111.2 is screwed into the insert 111.4 in order to connect the first component 109.1 and the second component 109.2 to one another in the connection region 109.3 via of the pretensioning force FV.

The two-part form of the connection unit 111.1 here has the feature that the properties of the two parts 111.3, 111.4 of the connection unit 111.1 can be adapted to the respective element with which the relevant part 111.3 and 111.4 directly cooperates. Thus, the main body 111.3 is adapted or optimized in terms of its cooperation with the first component 109.1, while the insert 111.4 is adapted or optimized in terms of its cooperation with the tensioning unit 111.2. Therefore, more degrees of optimization freedom are obtained as a result of this two-part form. This can be a considerable advantage over existing configurations, in which only one such interface was present (specifically between the tensioning element and the monolithic connection element).

Deviations in the properties of the main body 111.3 and of the insert 111.4 can be compensated within the connection unit 111.1, for example in the coupling region between the main body 111.3 and the insert 111.4, without resulting in adverse effects at the interface between the main body 111.3 and the first component 109.1 and at the interface between the insert 111.4 and the tensioning unit 111.2. For example, the insert 111.4 can be used to achieve a defined introduction of stresses into the main body 111.3 resulting from the pretensioning force FV that is over as large as possible a surface area and thus more uniformly and favorably distributed than in the case of existing configurations.

As will be described in more detail below, in the present example, for this purpose the main body 111.3 is adapted to the first component 109.1 and the connection thereto, for example in terms of its coefficient of thermal expansion. By contrast, the insert 111.4 is adapted to the use of a high-strength tensioning screw 111.2, for example in terms of undesired effects when the pretensioning force FV is being applied. This can make it possible to achieve considerably higher pretensioning forces FV between the two components 109.1, 109.2 compared to known configurations, which higher pretensioning forces considerably reduce the risk of undesired relative movements or displacements between the two components 109.1, 109.2. Ultimately, this results in a connection of the first and the second component 109.1, 109.2 which is stable in the long term and in the case of which the possible tightening torques or pretensioning forces can be considerably increased without an appreciably increase in the installation space.

Basically, the insert 111.4 may be connected to the main body 111.3 in any desired suitable way in order to achieve favorable introduction of the loads or stresses into the main body 111.3. In this respect, form-fitting, force-fitting and materially bonded connections (in one or more of the six degrees of freedom in space) can be used individually or in any desired combination. In the present example, the above-described favorable introduction of loads or stresses into the main body is achieved in that the insert 111.4, which is substantially cylindrical or formed in the manner of a sleeve, is connected to the main body 111.3 via a combined form-fitting and force-fitting connection in the form of a screwed connection with a thread run of a first thread in the form of a fine thread 111.6 on the outer side of the insert 111.4. This achieves a comparatively large contact surface, in the case of which local tolerances or deviations can be compensated by comparatively small local deformations. The thread run 111.6 of the screwed connection here defines a first thread longitudinal axis, which, in the mounted state, runs at least substantially parallel to the tensioning direction SR.

It is self-evident here that the insert 111.4 and/or the main body 111.3 can for their part likewise have a multi-part form in certain variants (with sufficient wall thickness). Thus, for example, the insert 111.4 may be formed from two or more coaxial sleeves nested in one another. These may be screwed to one another in a similar way (to the above-described screwed connection between the insert 111.4 and the main body 111.3). The same also applies to the main body 111.3. In this way, the properties can be adapted even more finely or gradually, and severe jumps in the properties of the components (e.g. its stiffness) or of their materials (e.g. modulus of elasticity, coefficient of thermal expansion, etc.) at their interfaces can be avoided. Therefore, differences in the properties between the tensioning element 111.2 and the main body 111.3, or ultimately the first component 109.1, can be compensated across multiple interfaces.

In the present example, the insert 111.4 is secured against rotation with respect to the main body 111.3 about an axis of rotation parallel to the tensioning direction SR, since this makes it possible to ensure that a torque introduced by the tensioning screw 111.2 does not result in rotation of the insert 111.4 with respect to the main body 111.3. This ensures a clear functional separation between the tensioning mechanisms at the interfaces between the insert and the tensioning screw 111.2 and between the insert and the main body 111.3. The rotation-prevention mechanism may in principle be realized in any desired way (form fit and/or frictional engagement and/or material bond).

Figure 5:
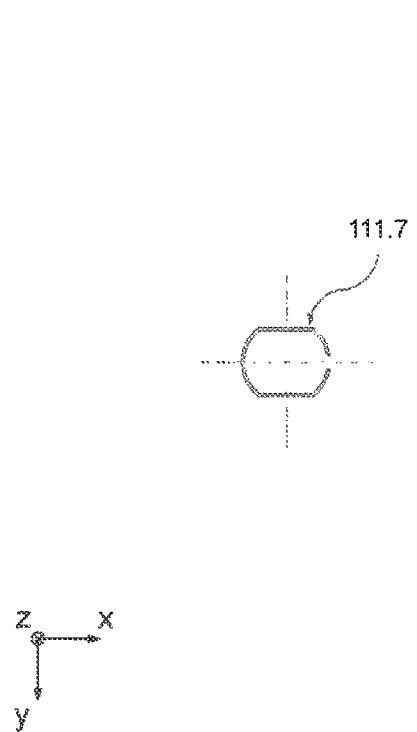
FIG. 5 is a schematic view of part of an alternative rotation-prevention mechanism for the arrangement from FIG. 2 (in a view similar to FIG. 4).

In the present example, a rotation-prevention element in the form of a securing clamp 111.7 is provided as a rotation-prevention mechanism, which rotation-prevention element secures the insert 111.4 against rotation with respect to the main body 111.3 about the axis of rotation. To that end, the ring-shaped securing clamp 111.7, which is slotted on one side, is inserted in a securing groove 111.8 in the main body 111.3, which securing groove is located at that end of the main body 111.3 that faces the tensioning screw 111.2. Flattened inner sides 111.9 on the two arms of the securing clamp 111.7 bear against correspondingly flattened end shoulders 111.10 of the insert 111.4 in order to produce the rotation-prevention mechanism. FIG. 5 shows an alternative configuration of the securing clamp 111.7, which, in that figure, is in the form of a simple, ring-shaped wire clamp that is open on one side and made of a spring material.

It is self-evident that, in other variants, the tensioning unit 111.2 and the insert 111.4 can also be connected to one another in basically any desired other suitable way (likewise a form fit and/or frictional engagement and/or material bond). In this respect, it is of course possible also to provide a functional separation between the tensioning mechanism and the connection to the insert 111.4. However, in the present example, a relatively simple and space-saving configuration incorporating both functions is realized via the tensioning screw 111.2, which is screwed into a threaded bore of a second thread in the form of a fine thread 111.11 on the inner side of the insert 111.4 in the tensioning direction SR. The first and the second thread longitudinal axis of the first and the second thread 111.6, 111.11 run at least substantially parallel to one another here, as a result of which a compact configuration which is relatively easy to produce and easy to join is obtained.

It furthermore goes without saying that the interfaces between the first and second components 109.1, 109.2 and the connection device 111 may in principle be configured in any desired suitable way. Thus, it may be provided, for example, that the connection device 111 laterally engages around the two components 109.1, 109.2 in the manner of a tension clamp. In the present example, the main body 111.3 is inserted in a first cutout in the form of a first through opening 109.5 in the first component 109.1.

The through opening 109.5 receives a first part or portion 111.15 of the main body 111.3, which adjoins a second part or portion 111.16 of the main body 111.3. The second portion 111.16 forms a projection 111.17 of the main body 111.3 beyond the first portion 111.15. The projection 111.17 of the main body 111.3 extends in the radial direction and in the circumferential direction of the main body 111.3. In the present example, the projection 111.17 of the main body 111.3 runs around the entire circumference of the main body 111.3 in the circumferential direction. In other variants, however, it is equally also possible to provide multiple circumferentially spaced-apart projections 111.16.

The projection 111.17 has a contact face 111.18, which faces the first component 109.1 in the tensioning direction SR and makes contact with a contact surface 109.7 (facing in the opposite direction, or in the direction of a longitudinal axis of the first through opening 109.5), which is adjacent to the first through opening 109.5. This realizes a relatively simple and structurally small configuration with favorable introduction of load into the first component 109.5.

The same applies for the second component 109.2, which has a second cutout in the form of a second through opening 109.6, which receives part of the tensioning screw 111.2. In the present example, for the purpose of coupling to the second component 109.2, the tensioning screw 111.2 has a bearing portion 111.12 that comprises a head portion 111.13 of the tensioning screw 111.2 and an intermediate washer 111.14. The bearing portion 111.12 cooperates with the second component 109.2 in a form-fitting manner in the tensioning direction SR. To that end, the second component 109.2 has a contact surface 109.8. The contact surface 109.8 is adjacent to the second cutout 109.6 and makes contact with a contact surface 111.19 on the intermediate washer 111.14 of the head portion 111.12 of the tensioning screw 111.2. The contact surface 111.19 faces the second component 109.2 in the direction of a longitudinal axis of the second through opening 109.6.

The interface 109.4 between the first component 109.1 and the second component 109.2 may be configured as desired. Thus, for example, one or more interface elements (indicated by the dashed outline 112 in FIG. 3) may be arranged between the first component 109.1 and the second component 109.2 (and be assigned to the first and/or second component). In the present example, in the mounted state, the first component 109.1 and the second component 109.2 make contact with one another in the region of the interface portion, which is formed by the contact region 109.4. This interface portion 109.4 may be spaced apart from the tensioning screw 111.2 to a greater or lesser extent. In the present example, the interface portion 109.4 is arranged in the region of the tensioning screw 111.2, wherein the interface portion 109.4 then surrounds the tensioning screw 111.2 in order to easily achieve a favorable distribution of the surface pressure created by the connection device 111 (via the pretensioning force FV) between the first and the second component 109.1, 109.2.

Relatively favorable configurations are produced furthermore when the insert 111.4 has a maximum length dimension LE in the longitudinal direction which amounts to 50% to 90%, such as 55% to 85%, for example at most 60% to 80%, of a maximum length dimension LG of the main body 111.4 in the longitudinal direction. This makes it possible to achieve, for example, a relatively favorable and uniform introduction of the loads from the insert 111.4 into the main body 111.3 over a large surface area.

It can furthermore be advantageous when the insert 111.4 has a maximum length dimension LE in the longitudinal direction and a maximum radial dimension RE in the radial direction, wherein the maximum length dimension LLE amounts to 80% to 500%, such as 150% to 300%, for example 200% to 250%, of the maximum radial dimension RE of the insert 111.4. This makes it possible to realize relatively compact configurations still with favorable introduction of loads into the main body 111.3.

In certain variants, as a result of the type of the thread 111.6 (standard thread, fine thread etc.) and the material pairing between the insert 111.4 and the main body 111.3, a certain minimum screw-in depth MET for screwing the insert 111.4 into the main body 111.3 is provided for a predefined maximum pretensioning force FV, wherein the value of the maximum length dimension LE then can range from 100% to 200%, such as from 120% to 180%, for example from 140% to 160%, of the minimum screw-in depth MET. This also makes it possible to respectively realize relatively compact configurations still with favorable introduction of loads into the main body 111.3.

The same applies when the first thread 111.6 has a first thread diameter GD1 and the second thread 111.11 has a second thread diameter GD2, wherein the first thread diameter GD1 amounts to 110% to 500%, such as 120% to 400%, for example 150% to 250%, of the second thread diameter GD2.

As already mentioned, the materials used, for example their coefficients of thermal expansion, can be adapted to one another. Therefore, the material of the first component 109.1 thus has a first coefficient of thermal expansion CTE1, whereas the material of the main body 111.3 has a second coefficient of thermal expansion CTE2, which can be adapted to one another. In the present example, in the mounted state (see FIG. 2), the main body 111.4 is connected to the first component 109.1 via a materially bonded connection in the form of an adhesive bond between the contact surfaces 109.7, 111.17. The first coefficient of thermal expansion CTE1 and the second coefficient of thermal expansion CTE2 are adapted to one another in such a way that a maximum stress SVMAX in the adhesive bond that is expected as a maximum in the event of thermal expansion during production and/or during normal operation of the arrangement 108 amounts to at most 90%, such as at most 75%, for example at most 45% to 55%, of a maximum permissible stress SVMAXZ in the adhesive bond. This configuration can for example be advantageous when the maximum stress in the adhesive bond is to be expected in the event of a heat treatment of the arrangement 108 during production, since this makes it possible to reliably avoid damage during production. The same applies when correspondingly high temperatures or temperature changes occur during transport or during operation.

In variants, the second coefficient of thermal expansion CTE2 differs from the first coefficient of thermal expansion CTE1 by less than 200%, such as less than 100%, for example less than 10% to 50%, of the first coefficient of thermal expansion CTE1, since this makes it possible to achieve relatively favorable results.

In terms of the selection of materials, there is a very great freedom of selection by virtue of the two-part form of the connection unit 111.1. In favorable variants, the first component 109.1 and/or the second component 109.2 comprises at least one ceramic material, wherein the ceramic material comprises for example reaction-bonded, silicon-infiltrated silicon carbide (SiSiC) and/or silicon carbide (SiC) and/or aluminum oxide ceramic ($Al_2O_3$) and/or silicon nitride ceramic ($Si_3N_4$) and/or zirconium oxide ($ZrO_2$) and/or aluminum titanate ($Al_2TiO_5$), or at least one metallic material having a low coefficient of thermal expansion, for example Inermet, molybdenum (Mo) and/or a titanium-zirconium-molybdenum alloy (TZM). In the present example, the first component 109.1 and the second component 109.2 are formed from the same material, specifically reaction-bonded, silicon-infiltrated silicon carbide (SiSiC).

The main body 111.3 may comprise a material correspondingly suitable for coupling to the first component 109.1. The main body 111.3 can comprise at least one metallic material with a modulus of elasticity amounting to at least 220 GPa, such as at least 250 GPa to 320 GPa, for example at least 280 GPa to 300 GPa. This makes it possible to realize configurations enabling a high stiffness and thus a favorable introduction of load into the first component 109.1 for a relatively compact structure. In further preferred variants, the main body 111.3 comprises at least molybdenum (Mo) and/or a titanium-zirconium-molybdenum alloy (TZM) and/or a tungsten alloy. These are relatively suitable for coupling to the materials mentioned for the first component 109.1. In the present example, a titanium-zirconium-molybdenum alloy (TZM) is used for the main body 111.3.

The material of the insert 111.4 and of the tensioning screw 111.2 can also be of course adapted to the specific use case and its boundary conditions. For example, they are adapted to the pretensioning force FV that is to be achieved between the components 109.1, 109.2 to be connected. In the present example, a maximum pretensioning force FVMAX is predefined that, in the mounted state, is exerted by the connection device 111 in the tensioning direction SR between the first component 109.1 and the second component 109.2 in the connection region 109.3. In that case, the insert 111.4 can comprise a first material and the tensioning screw 111.2 comprises a second material, wherein the first material and the second material are adapted to one another in such a way that no fretting effects occur when the maximum pretensioning force FVMAX is applied to the contact surfaces between the insert 111.4 and the tensioning screw 111.2. This makes it possible, for example, to ensure that a predefined pretensioning force FV is also actually achieved for a predefined tightening torque.

It can be relatively advantageous when the insert 111.4 comprises at least one nitrogen-strengthened stainless steel alloy, for example Nitronic 60, and/or gold-plated steel and/or silver-plated steel and/or kolsterised steel. In the present example, the insert 111.4 therefore consists of a nitrogen-strengthened stainless steel alloy, specifically Nitronic 60. It can be similarly advantageous when the tensioning screw 111.2 comprises at least one high-strength austenitic stainless steel alloy, for example A4-70 and/or A4-80 and/or A5-80 and/or Inconel and/or A-286, and/or MP35N and/or HiMo88. In the present example, the tensioning screw 111.2 therefore consists of a high-strength austenitic stainless steel alloy, specifically A4-70.

The main body 111.3 can be furthermore configured in such a way that, when the maximum pretensioning force FVMAX is applied at least in the region of the first contact surface 111.18, a maximum stress SGMAX in the main body 111.3 is below the 0.2% yield strength Rp0.2 of the material of the main body 111.3, wherein the maximum stress SGMAX for example amounts to 75% to 95%, such as 80% to 92%, for example 85% to 90%, of the 0.2% yield strength Rp0.2 of the material of the main body 111.3. This makes it possible to obtain a compact configuration with relatively good utilization of the strength properties of the main body 111.3, combined with reliable coupling of the first and the second component 109.1, 109.2.

Furthermore, the main body 111.3 may be configured in such a way that, when the maximum pretensioning force FVMAX is applied, a maximum stress SVMAX, for example a maximum shear stress or a maximum tensile stress (for example in the region of the outer circumference), in the adhesive bond between the first contact surface 111.18 and the second contact surface 109.7 is below a maximum permissible stress SVMAXZ for the adhesive bond. This makes it possible to reliably avoid failure of the adhesive bond by way of the configuration of the main body 111.3. In this respect, the maximum stress SVMAX in the adhesive bond may for example amount to 75% to 95%, such as 80% to 92%, for example 85% to 90%, of the maximum permissible stress SVMAXZ for the adhesive bond, resulting in largely optimized ratios. All of this is possible with the configurations described above, in the case of which the main body 111.3, by way of a suitable material selection and a suitable geometry, has sufficient stiffness that, when the maximum pretensioning force FVMAX is applied, a deformation of the main body 111.3 in the region of the adhesive bond with the first component 109.1 is low enough to keep the combined state of stress, but for example the shear stresses, below the maximum permissible value for the adhesive bond.

It is self-evident that the main body 111.3, in principle, can be configured in any desired suitable way. Thus, the main body 111.3 may, for example, simply have a disk-shaped or plate-shaped form. In this case, the main body 111.3 could thus for example consist only of the second portion 111.16, wherein, in that case, a correspondingly larger length dimension of the second portion 111.16 would be desirable to ensure sufficient stiffness. In the present example, however, a configuration is realized in which, in the longitudinal direction, the main body 111.3 comprises the first portion 111.15 and the adjacent second portion 111.16. This is relatively space-saving, since the first portion 111.15, which contributes to the stiffness and uniform introduction of load, is received in the first through opening 109.5 (therefore is arranged in a nested manner).

In the present example, the first portion 111.15 is elongate and has a cylindrical form in the longitudinal direction. In this respect, a maximum length dimension LG1 of the first portion 111.15 in the longitudinal direction can amount to 150% to 300%, such as 180% to 250%, for example 200% to 230%, of the maximum diameter RG1 of the first portion 111.15, the first portion 111.15 having this maximum diameter at its transition to the second portion 111.16 in the radial direction. This can make it possible to obtain advantageous configurations with favorable introduction of load into the main body 111.3 and transfer of the load into the first component 109.1. The same applies when a maximum wall thickness WG1 of the first portion 111.15 in the radial direction amounts to 2.5% to 25%, pr such as eferably 5% to 20%, for example 10% to 15%, of the maximum diameter RG1 of the first portion 111.15.

A relatively favorable introduction of load into the first component can be achieved in all other respects when the projection 111.17 projects beyond the first portion 111.15 in the radial direction by 110% to 250%, such as 120% to 220%, for example 150% to 200%, of the maximum diameter RG1 of the first portion 111.15. A relatively advantageous stiffness distribution in terms of the introduction of load into the first component 109.1 can be achieved for example when the projection 111.17, in the longitudinal direction, has a thickness dimension DV, which, for example, amounts to 150% to 300%, such as 160% to 250%, for example 180% to 200%, of the maximum diameter RG1 of the first portion 111.15.

In this respect, the projection 111.17 may have a substantially constant thickness dimension DV in the radial direction. Equally, however, the projection 111.17 may taper outward in the radial direction, like in the present example. This makes it possible to account for the stress distribution in the first portion 111.15, since in such edge regions relatively far from the force flow (from the tensioning screw 111.1 to the contact surface 111.18) only comparatively small stresses arise, and such edge regions therefore in any case scarcely appreciably contribute to the stiffness for the use case.

As can furthermore be seen in FIGS. 2 and 3, in the present example, in the region of the receiving cutout 111.5 the second portion 111.16 also has a ventilation bore 111.20, through which air can escape when the screwed connection is being established via the tensioning screw in order to avoid, in the course of generating a vacuum in the imaging device 101, so-called virtual leakage (caused by air escaping only slowly from the cavity) and thereby reduce evacuation pumping times. Equally, parasitic loads on the connection unit 111.1 that could result owing to the compression of the air volume in the receiving cutout 111.5 can possibly be avoided.

As already mentioned, the first and the second component 109.1, 109.2 may in principle be any desired components of the imaging device that are connected to one another with corresponding operational reliability and dimensional accuracy. In the present example, they are components of the projection device 103. In other variants, however, the first and the second component 109.1, 109.2 may also be parts of an illumination device 102 of the imaging device 101. They may in turn be parts of a support structure of the imaging device 101 that bears highly sensitive components of the imaging device 101. Similar advantages can result when the first and the second component 109.1, 109.2 are parts of the mask device 104 of the imaging device 101, for example, when they are parts of a support structure for a mask 104.1 of the imaging device 101. The same applies when the first and the second component 109.1, 109.2 are parts of the substrate device 105 of the imaging device 101, for example, are parts of a support structure for the wafer 105.1 of the imaging device 101.

The configuration described above makes it possible to perform the method according to the disclosure for connecting the first component 109.1 and the second component 109.2 of the imaging device 101 in the way described above. In this respect, reference is therefore made to the explanations given above in order to avoid repetition.

With preference, in a first step, the connection between the connection unit 111.1 and the first component 109.1 is established, wherein the connection unit in the present example is adhesively bonded to the first component 109.1. In a second step, which follows the first step, the first component 109.1 and the second component 109.2 are then brought into contact with one another in the contact region 109.4 of the connection region 109.3. In the process, an intermediate element 112 can optionally be introduced between the first component 109.1 and the second component 109.2. In a third step, which follows the second step, the tensioning unit 111.2 is then brought into engagement with the connection unit 111.1 and with the second component 109.2 in such a way that the first component 109.1 and the second component 109.2 can be connected to one another in the connection region 109.1. In the process, a sufficiently high pretensioning force FV, via which the first component 109.1 and the second component 109.2 are braced against one another in the contact region 109.4, is created at the tensioning screw 111.2 by a corresponding torque.

In this respect, in the present example the connection device 111 is used to exert an actual pretensioning force FV in the tensioning direction SR between the first component 109.1 and the second component 109.2 in the contact region 109.4 of the connection region 109.3, which actual pretensioning force is greater than a nominal pretensioning force FVN to fix the first component 109.1 and the second component 109.2 to one another under all loads to be expected during normal operation of the imaging device 101. In this respect, the actual pretensioning force FV can for example amount to 120% to 250%, such as 150% to 220%, for example 160% to 200%, of the nominal pretensioning force FVN. This makes it possible to achieve a reliable fixation of the two components 109.1, 109.2 to one another, in the case of which the above-described creep or skip effects can be avoided.

Second to Fourth Embodiments

Further preferred embodiments of the arrangement 209, 309, 409 according to the disclosure, each of which can be used in the facet mirror 108 of the imaging device 101 instead of the arrangement 109, are described below with reference to FIGS. 1 and 6 to 8. The arrangement 209, 309, 409, in its basic design and functionality, respectively corresponds to the arrangement 109 from FIGS. 2 to 4, and so only the differences are to be discussed here. For example, identical components are provided with identical reference signs, while components of the same type are provided with reference signs increased by the value 100 (second embodiment), 200 (third embodiment) and 300 (fourth embodiment). Unless stated otherwise below, reference is made to the above statements in connection with the first embodiment with regard to the features and functions of these components.

The difference in relation to the first embodiment in each case is merely the configuration of the connection unit 211.1, 311.1 and 411.1, respectively, in terms of the rotation-prevention mechanism, as will be explained below. All other components may be designed identically to the first embodiment. In this respect, the bottom part of each of FIGS. 6 to 8 shows an illustration of the individual components and the top part of each of these figures shows the assembled state of the connection unit 211.1, 311.1 and 411.1, respectively.

Figure 6:
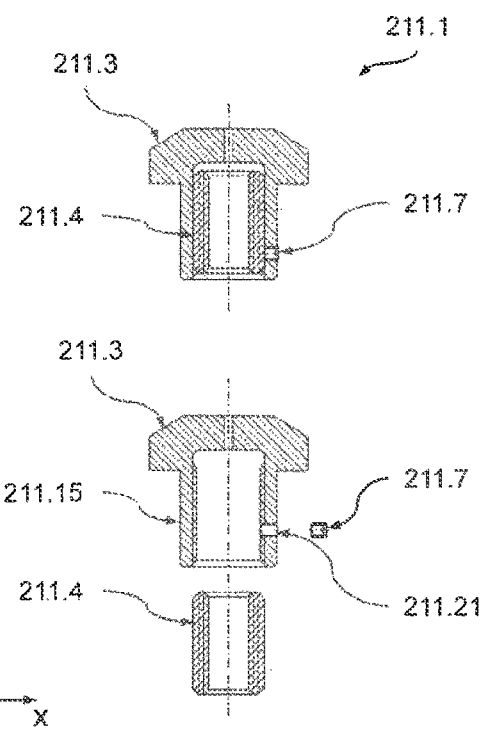
FIG. 6 is a schematic view of parts of a further embodiment of an optical arrangement according to the disclosure (in a view similar to FIG. 2).

For the configuration of the connection unit 211.1 of the second embodiment from FIG. 6, the rotation prevention is effected by a rotation-prevention element in the form of a securing screw 211.7, via which the insert 211.4 is secured against rotation with respect to the main body 211.3 about the axis of rotation. To that end, the securing screw 111.7 (in the manner of a set screw) is screwed into a securing bore 211.21 in the main body 211.3. The securing bore 211.21 runs in the radial direction in the first part or portion 211.15 of the main body 211.3, with the result that the securing screw 111.7 makes contact with the insert 211.4 and secures it (for example fixedly clamps it or even penetrates it in order to obtain a form fit) against rotation with respect to the main body 211.3 about the axis of rotation by virtue of a correspondingly high contact force. It is self-evident that, in other variants, of course multiple such securing screws 111.7 for rotation prevention can be provided.

Apart from the rotation-prevention mechanism, the insert 211.4 and the main body 211.3 of the connection unit 211.1 are identical to the components of the connection unit 111.1 of the first embodiment in terms of their configuration, function, variants and features, and therefore explicit reference is made to the above embodiments in this respect.

Figure 7:
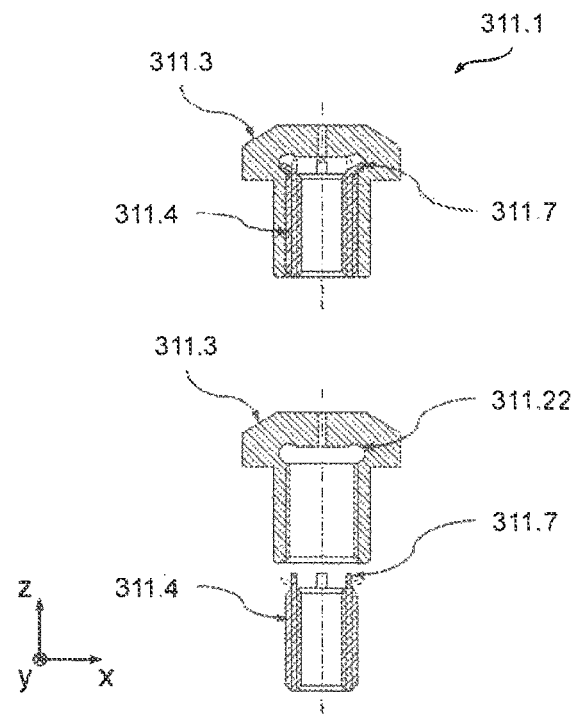
FIG. 7 is a schematic view of parts of a further embodiment of an optical arrangement according to the disclosure (in a view similar to FIG. 2).
Figure 8:
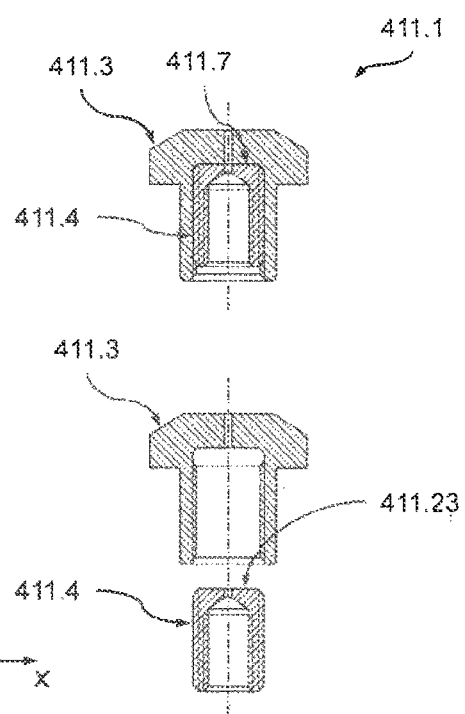
FIG. 8 is a schematic view of parts of a further embodiment of an optical arrangement according to the disclosure (in a view similar to FIG. 2).

With the configuration of the connection unit 311.1 of the third embodiment from FIG. 7, the rotation prevention is effected by multiple rotation-prevention elements in the form of thin projections 311.4, via which the insert 311.4 is secured against rotation with respect to the main body 311.3 about the axis of rotation. The projections 311.7 are formed in one piece with the insert 311.4 and arranged (uniformly or, as desired, non-uniformly) distributed in a manner offset in relation to one another around the circumference of the main body 311.3. Any desired number of projections 311.7 may be provided. Optionally, a single such projection 311.7 may also be sufficient.

The projections 311.7 are aligned along the axis of rotation during mounting, with the result that the insert 311.4 can be screwed freely into the main body 311.3. When the insert 311.4 is in its final position, the projections 311.7 are bent radially outward and thus plastically deformed such that they engage permanently in an undercut 311.22 in the main body 311.3. In the process, the projections 311.7 make contact with the main body 311.3 and exert a correspondingly high contact force, which secures against rotation with respect to the main body 311.3 about the axis of rotation (the undercut 311.22 may possibly have a corresponding configuration in order to obtain a form fit in the circumferential direction as well). Apart from the rotation-prevention mechanism, the insert 311.4 and the main body 311.3 of the connection unit 311.1 are identical to the components of the connection unit 111.1 of the first embodiment in terms of their configuration, function, variants and features, and therefore explicit reference is made to the above embodiments in this respect.

With the configuration of the connection unit 411.1 of the fourth embodiment from FIG. 8, the rotation prevention is effected by an adhesive bond 411.7 at the inner end of the insert 411.4, via which adhesive bond the insert 411.4 is adhesively bonded to the main body 411.3 and thus secured against rotation with respect to the main body 411.3 about the axis of rotation. The adhesive bond 411.7 is made at an end surface 411.23 of the insert 411.4. Apart from the rotation-prevention mechanism, the insert 411.4 and the main body 411.3 of the connection unit 411.1 are identical to the components of the connection unit 111.1 of the first embodiment in terms of their configuration, function, variants and features, and therefore explicit reference is made to the above embodiments in this respect.

The present disclosure has been described above exclusively on the basis of examples from the microlithographic field. However, it is self-evident that the disclosure can also be used in the context of any desired other optical applications, for example, imaging methods at different wavelengths, in which similar issues can arise in terms of the connection of individual components.

Furthermore, the disclosure can be used in connection with the inspection of objects, such as for example so-called mask inspection, in which the masks used for microlithography are inspected for their integrity, etc. In FIG. 1, a sensor unit, for example, which detects the imaging of the projection pattern of the mask 104.1 (for further processing), then takes the place of the substrate 105.1. This mask inspection can then take place substantially at the same wavelength as is used in the later microlithographic process. However, it is similarly possible also to use any desired wavelengths deviating therefrom for the inspection.

Lastly, the present disclosure was described above on the basis of specific embodiments, which show specific combinations of the features defined in the following patent claims. It should expressly be pointed out at this juncture that the subject matter of the present disclosure is not restricted to these combinations of features, rather all other combinations of features such as are evident from the following patent claims also belong to the subject matter of the present disclosure.

What is claimed is:
1. An arrangement, comprising:
a first component;
a second component; and
a connection unit of a connection device,
wherein:
the connection unit is configured to cooperate with the first component in a connection region between the first and second components;
the connection unit comprises a tensioning unit, a main body and an insert;
the connection unit is configured to cooperate, in a mounted state, with the tensioning unit in a tensioning direction;
the tensioning unit is configured to cooperate with the second component to connect the first and second component to one another in the connection region;

the insert is in a receiving cutout in the main body and connected to the main body to transfer forces in the tensioning direction;

the insert is configured to cooperate with the tensioning unit to connect the first and second components to one another in the connection region so that the first and second components are braced against each other by a pretensioning force along the tensioning direction; and the arrangement is an EUV microlithographic imaging device arrangement.

2. The arrangement of claim 1, wherein at least one of the following holds:

the insert is connected to the main body via a form-fitting and/or a force-fitting connection;

the insert is connected to the main body via a screwed connection, wherein a thread run of the screwed connection defines a thread longitudinal axis, and the thread longitudinal axis runs at least substantially parallel to the tensioning direction; and the insert is secured against rotation with respect to the main body about an axis of rotation parallel to the tensioning direction.

3. The arrangement of claim 1, wherein, in the mounted state, the tensioning unit and the insert are connected via a form-fitting and/or a force-fitting connection.

4. The arrangement of claim 3, wherein at least one of the following holds:

the tensioning unit comprises a tensioning screw screwed into a threaded bore of the insert in the tensioning direction;

the tensioning unit comprises a bearing portion cooperating with the second component in a form-fitting manner in the tensioning direction; and part of the tensioning unit is guided through a cutout in the second component, the cutout extending in the tensioning direction.

5. The arrangement of claim 1, wherein the insert defines a longitudinal direction, a radial direction and a circumferential direction, the insert comprises an outer side configured to couple to the main body, and the insert comprises an inner side configured to couple to the tensioning unit.

6. The arrangement of claim 5, wherein at least one of the following holds:

the outer side comprises a first thread configured to couple to the main body, and/or the inner side comprises a second thread configured to couple to the tensioning unit;

the insert has a substantially cylindrical form; and the insert comprises a sleeve.

7. The arrangement of claim 5, wherein at least one of the following holds:

the insert has a maximum length dimension in the longitudinal direction that is 50% to 90% of a maximum length dimension of the main body in the longitudinal direction;

the insert has a maximum length dimension in the longitudinal direction and a maximum radial dimension in the radial direction, wherein the maximum length dimension is 80% to 500% of the maximum radial dimension of the insert;

the insert has a maximum length dimension in the longitudinal direction and a minimum screw-in depth for screwing the first thread into the main body is predefined or a predefined maximum pretensioning force, wherein the maximum length dimension is 100% to 200% of the minimum screw-in depth; and the first thread has a first thread diameter and the second thread has a second thread diameter, wherein the first thread diameter is 110% to 500% of the second thread diameter.

8. The arrangement of claim 1, wherein the material of the first component has a first coefficient of thermal expansion and the material of the main body has a second coefficient of thermal expansion.

9. The arrangement of claim 8, wherein at least one of the following holds:

the main body, in a mounted state, is connected to the first component via a materially bonded connection, and the first coefficient of thermal expansion and the second coefficient of thermal expansion are adapted to one another in such a way that a maximum stress in the materially bonded connection that is expected as a maximum in the event of thermal expansion during production and/or during normal operation of the arrangement is at most 90% of a maximum permissible stress in the materially bonded connection; and the second coefficient of thermal expansion differs from the first coefficient of thermal expansion by less than 200% of the first coefficient of thermal expansion.

10. The arrangement of claim 1, wherein at least one of the following holds:

the first component and/or the second component comprises at least one ceramic material;

the main body comprises at least one metallic material with a modulus of elasticity, the modulus of elasticity of at least 220 GPa; and the main body comprises at least one member selected from the group consisting of molybdenum (Mo), titanium-zirconium-molybdenum alloy, and a tungsten alloy.

11. The arrangement of claim 1, wherein at least one of the following holds:

a maximum pretensioning force is predefined that, in the mounted state, is exerted by the connection device in the tensioning direction between the first component and the second component in the connection region, the insert comprises a first material and the tensioning unit comprises a second material, and the first and second materials are adapted to one another in such a way that no fretting effects occur when the maximum pretensioning force is applied to the contact surfaces between the insert and the tensioning unit;

the insert comprises at least one nitrogen-strengthened stainless steel alloy; and the tensioning unit comprises at least one high-strength austenitic stainless steel alloy.

12. The arrangement of claim 1, wherein:

the main body defines a longitudinal direction, a radial direction running transversely to the longitudinal direction, and a circumferential direction around the circumference of the longitudinal direction;

the main body comprises a projection extending in the radial direction and in the circumferential direction;

the projection has a first contact surface by which, in the mounted state, a form fit is produced in the tensioning direction with a second contact surface of the first component.

13. The arrangement of claim 12, wherein:

a maximum pretensioning force is predefined that, in the mounted state, is exerted by the connection device in the tensioning direction between the first component and the second component in the connection region; and at least one of the following holds:
the main body is configured so that, when the maximum pretensioning force is applied at least in the region of the first contact surface, a maximum stress in the main body is below the 0.2% yield strength of the material of the main body; and
the main body is configured so that, when the maximum pretensioning force is applied, a maximum stress in the materially bonded connection between the first contact surface and the second contact surface is below a maximum permissible stress for the materially bonded connection.

14. The arrangement of claim 12, wherein:
in the longitudinal direction, the main body has a first portion and an adjacent second portion defining the projection;
the first portion has a maximum diameter at a transition to the second portion in the radial direction; and
the receiving cutout in the main body runs in the longitudinal direction of the main body, wherein the longitudinal direction, in the mounted state, in particular, runs in the tensioning direction.

15. The arrangement of claim 14, wherein at least one of the following holds:
the first portion has a form that is elongate and/or prismatic at least in certain portions and/or cylindrical at least in certain portions in the longitudinal direction;
the projection, in the radial direction, projects beyond the first portion by 110% to 250% of the maximum diameter of the first portion; and
the projection, in the longitudinal direction, has a thickness dimension that is 150% to 300% of the maximum diameter of the first portion.

16. The arrangement of claim 1, wherein at least one of the following holds:
the first component has a first cutout configured to receive at least part of the main body, the first component has a contact surface configured to make contact with a projection of the main body, and the contact surface is adjacent to the first cutout and faces in the direction of a longitudinal axis of the first cutout;
the second component has a second cutout configured to receive at least part of the tensioning unit, the second component has a contact surface configured to make contact with a bearing portion of the tensioning unit, and the contact surface is adjacent to the second cutout and faces in the direction of a longitudinal axis of the second cutout; and
the first component and the second component, in the mounted state, make contact with one another in the region of at least one interface portion, the interface portion is in a region of the tensioning unit, and the interface portion surrounds the tensioning unit.

17. The arrangement of claim 1, wherein one of the following holds:
the first component and the second component are parts of an illumination device of the imaging device or of a projection device of the imaging;
the first component and the second component are parts of a mask device of the imaging device; and
the first component and the second component are parts of a substrate device of the imaging device.

18. An optical imaging device, comprising:
an illumination device configured to illuminate an object field; and
a projection device configured to project an image of the object field into an image field,
wherein the illumination device and/or the object device and/or the projection device and/or the image device comprises an arrangement according to claim 1.

19. A method for connecting a first component and a second component of an EUV microlithographic imaging device, the method comprising:
bringing a connection unit of a connection device into engagement with the first component so that the connection unit cooperates with the first component in a connection region between the first and second components; and
bringing a tensioning unit of the connection device into engagement with the connection unit and with the second component so that the connection unit cooperates with the tensioning unit in a tensioning direction to connect the first component and the second component to one another in the connection region,
wherein:
a main body comprises an insert used for the connection unit;
the insert is inserted into a receiving cutout in the main body and connected to the main body to transfer forces in the tensioning direction; and
the insert cooperates with the tensioning unit to connect the first component and the second component to one another in the connection region so that the first and second components are braced against each other by a pretensioning force along the tensioning direction.

20. The method of claim 19, further comprising:
a) establishing the connection between the connection unit and the first component, by adhesively bonding the connection unit to the first component;
b) after a), bringing the first and second components into contact with one another in a connection region;
c) bringing the tensioning unit into engagement with the connection unit and with the second component so that the first component and the second component are connectable to one another in the connection region; and
using the connection device to exert an actual pretensioning force in the tensioning direction between the first component and the second component in the connection region,
wherein the actual pretensioning force is greater than a nominal pretensioning force to fix the first component and the second component to one another under all loads to be expected during normal operation or during the production of the imaging device, and the actual pretensioning force is 120% to 250% of the nominal pretensioning force.

21. An arrangement, comprising:
a first component;
a second component; and
a connection unit of a connection device,
wherein:
the connection unit is configured to cooperate with the first component in a connection region between the first and second components;
the connection unit comprises a tensioning unit, a main body and an insert;
the connection unit is configured to cooperate, in a mounted state, with the tensioning unit in a tensioning direction;
the tensioning unit is configured to cooperate with the second component to connect the first and second component to one another in the connection region;

the insert is in a receiving cutout in the main body and connected to the main body to transfer forces in the tensioning direction;

the insert is configured to cooperate with the tensioning unit to connect the first and second components to one another in the connection region;

the main body defines a longitudinal direction, a radial direction running transversely to the longitudinal direction, and a circumferential direction around the circumference of the longitudinal direction;

the main body comprises a projection extending in the radial direction and in the circumferential direction;

the projection has a first contact surface by which, in the mounted state, a form fit is produced in the tensioning direction with a second contact surface of the first component; and the arrangement is an EUV microlithographic imaging device arrangement.

22. A method for connecting a first component and a second component of an EUV microlithographic imaging device, the method comprising:

bringing a connection unit of a connection device into engagement with the first component so that the connection unit cooperates with the first component in a connection region between the first and second components; and bringing a tensioning unit of the connection device into engagement with the connection unit and with the second component so that the connection unit cooperates with the tensioning unit in a tensioning direction to connect the first component and the second component to one another in the connection region, wherein:
a main body comprises an insert used for the connection unit;

the insert is inserted into a receiving cutout in the main body and connected to the main body to transfer forces in the tensioning direction; and the insert cooperates with the tensioning unit to connect the first component and the second component to one another in the connection region, wherein the method further comprises:
a) establishing the connection between the connection unit and the first component, by adhesively bonding the connection unit to the first component;

b) after a), bringing the first and second components into contact with one another in a connection region;

c) bringing the tensioning unit into engagement with the connection unit and with the second component so that the first component and the second component are connectable to one another in the connection region; and using the connection device to exert an actual pretensioning force in the tensioning direction between the first component and the second component in the connection region, wherein the actual pretensioning force is greater than a nominal pretensioning force to fix the first component and the second component to one another under all loads to be expected during normal operation or during the production of the imaging device, and the actual pretensioning force is 120% to 250% of the nominal pretensioning force.

* * * * *

UNITED STATES PATENT AND TRADEMARK OFFICE
CERTIFICATE OF CORRECTION

| | | |
|---|---|---|
| PATENT NO. | : 12,298,674 B2 | Page 1 of 1 |
| APPLICATION NO. | : 18/066845 | |
| DATED | : May 13, 2025 | |
| INVENTOR(S) | : Viktor Schulga, Maximilian Schwenk and Henner Baitinger | |

It is certified that error appears in the above-identified patent and that said Letters Patent is hereby corrected as shown below:

In the Specification

Column 7, Line 18, after "such" insert -- as --.

Column 19, Line 27, delete "pr such as eferably" and insert -- preferably such as --.

Signed and Sealed this
Twenty-fourth Day of June, 2025

Coke Morgan Stewart
*Acting Director of the United States Patent and Trademark Office*